United States Patent [19]

Kugo

[11] Patent Number: 5,709,024
[45] Date of Patent: Jan. 20, 1998

[54] APPARATUS FOR ASSEMBLING ELECTRONIC COMPONENT

[75] Inventor: Daisaku Kugo, Nagaokakyo, Japan

[73] Assignee: Murata Manufacturing Co., Ltd., Japan

[21] Appl. No.: 532,480

[22] Filed: Sep. 22, 1995

Related U.S. Application Data

[62] Division of Ser. No. 202,149, Feb. 24, 1994, Pat. No. 5,575,050.

[30] Foreign Application Priority Data

Feb. 26, 1993 [JP] Japan ................................. 5-62872

[51] Int. Cl.$^6$ ................................................. H01L 41/22
[52] U.S. Cl. .................. 29/747; 29/238; 29/757; 29/759; 29/760; 29/842
[58] Field of Search ........................... 29/25.35, 235, 29/238, 747, 754, 757, 759, 760, 842, 881; 310/345, 348, 354, 368; 333/187, 189, 190; 269/903

[56] References Cited

U.S. PATENT DOCUMENTS

| | | | |
|---|---|---|---|
| 3,325,886 | 6/1967 | Olsen | 29/760 |
| 4,780,093 | 10/1988 | Walse et al. | 29/881 X |
| 4,868,971 | 9/1989 | Prevot et al. | 29/238 X |
| 5,148,596 | 9/1992 | Jahn | 29/842 |

*Primary Examiner*—Peter Vo
*Attorney, Agent, or Firm*—Ostrolenk, Faber, Gerb & Soffen, LLP

[57] ABSTRACT

An apparatus for assembling an electronic component, such as a ladder-type filter, having at least one element being held between terminal plates under pressure and stored in a case. First, the terminal plates are inserted in a cavity of a base so as to align the terminal plates along a direction of thickness thereof. Then, the element is inserted between the terminal plates in the cavity, and a spring plate is inserted in the cavity at an outside of one of the terminal plates. Thereafter, all parts inserted in the cavity are compressed by a presser along the direction of thickness so that an overall thickness of the parts is smaller than an inner size of the case. Then, the case is set on the base, and all parts are inserted from the cavity into the case simultaneously. Electrode surfaces of the element are not damaged since they are not in sliding contact with the terminal plates, and working efficiency is improved by this compressed insertion.

9 Claims, 12 Drawing Sheets

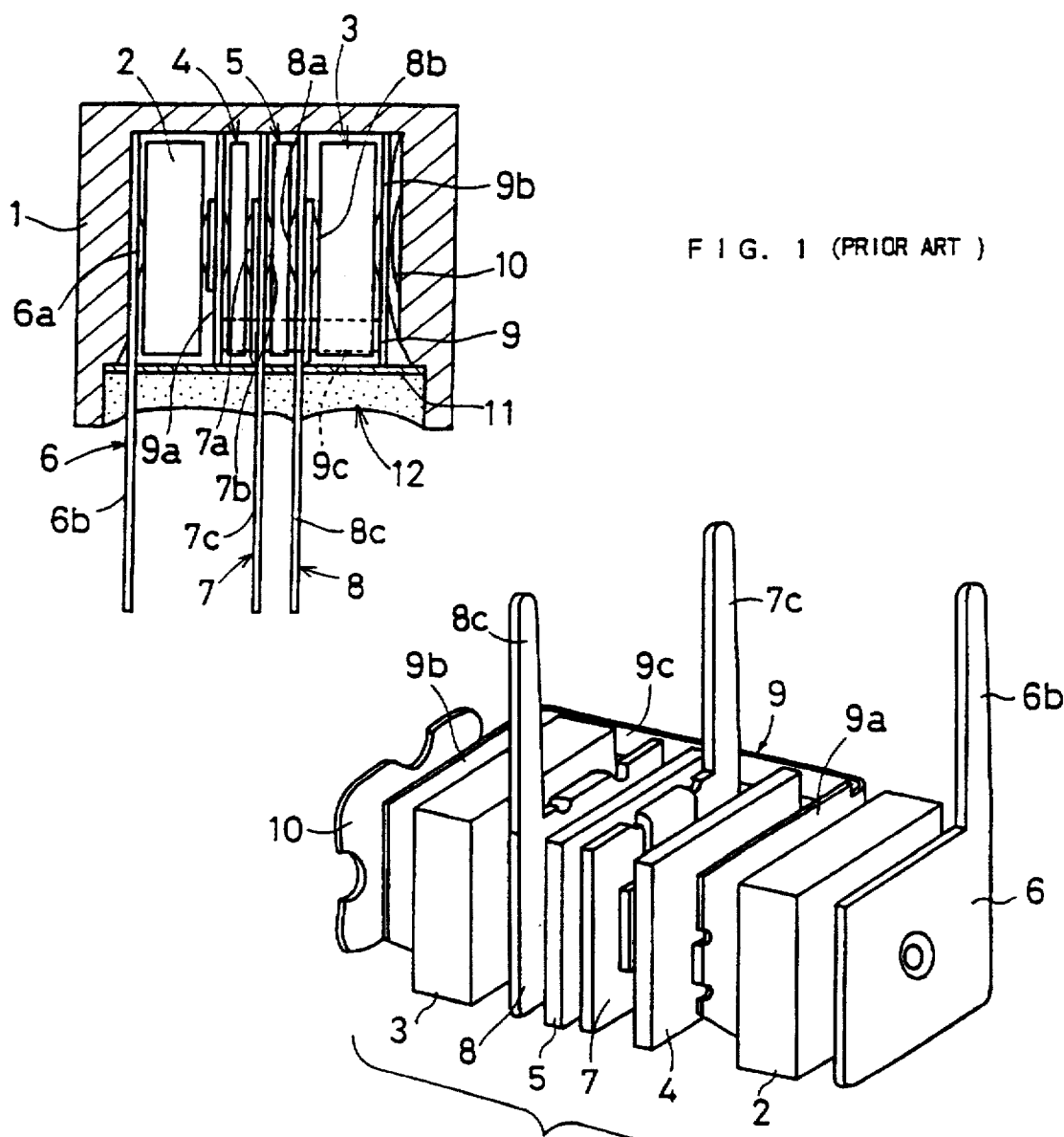
FIG. 1 (PRIOR ART)
FIG. 2 (PRIOR ART)
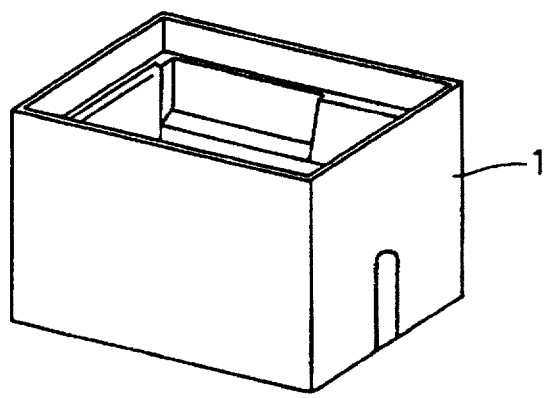

APPARATUS FOR ASSEMBLING ELECTRONIC COMPONENT

This is a division of application Ser. No. 08/202,149, filed Feb. 24, 1994, now U.S. Pat. No. 5,575,050.

BACKGROUND OF THE INVENTION

The present invention relates to a method of and an apparatus for assembling an electronic component, such as a ladder-type filter, having at least one element being held between terminal plates under pressure and stored in a case.

FIGS. 1 and 2 show a conventional four-element ladder-type filter. This filter comprises two series ceramic resonators 2 and 3, two parallel ceramic resonators 4 and 5, an input terminal plate 6, a ground terminal plate 7, an output terminal plate 8, an internal connection terminal plate 9 and a plate spring 10, which are stored in a box-type case 1. Outlines of these inner parts are substantially equivalent to each other. FIG. 3 is a circuit diagram showing the electrical connection thereof.

The input terminal 6 is provided on its one major surface with a protruding portion 6a which is in pressure contact with a central portion of the series resonator 2. The ground terminal 7 is provided on its both major surfaces with protruding portions 7a and 7b which are in pressure contact with central portions of the two parallel resonators 4 and 5 respectively. The output terminal 8 is provided on its both major surfaces with protruding portions 8a and 8b which are in pressure contact with central portions of the parallel resonator 5 and series resonator 3 respectively. The internal connection terminal 9 has a portion 9a which is inserted between the series resonator 2 and parallel resonator 4, a portion 9b which is arranged next to an outer major surface of the series resonator 3, and a coupling portion 9c which connects these portions 9a and 9b. Since the plate spring 10 is interposed between the portion 9b and an inner side surface of the case 1, the terminals 6–9 and the resonators 2–5 are in pressure contact with each other to be electrically connected.

A cover sheet 11 is inserted in an opening of the case 1, and a cavity which is defined by the cover sheet 11 and the opening is filled up with filler 12 such as resin, thereby the opening of the case 1 is sealed. Lead portions 6b, 7c and 8c of the input terminal 6, the ground terminal 7 and the output terminal 8 protrude from the opening of the case 1.

In the conventional ladder-type filter having the aforementioned structure, the resonators 2–5 utilizing surface-directional spreading vibration mode are merely in point contact with the terminals 6–9 at the central protruding portions 6a, 7a, 7b, 8a and 8b. Therefore, it is necessary to manually insert the resonators 2–5 and the terminals 6–9 into the case 1 one by one with tweezers since these parts easily get slant due to the point contact. As a result, working efficiency of assembling operation became quite low. Further, since it is necessary to bring all parts into close contact with each other in the final stage of assembly, much time is required for inserting the final part into a very small clearance. Moreover, electrode surfaces of the resonators 2–5 may be damaged by the assembling operation.

Thus, the conventional method of assembling electronic component such as a ladder-type filter had a problem of low working efficiency caused by manual assembly.

SUMMARY OF THE INVENTION

Accordingly, an object of the present invention is to provide a method of and an apparatus for assembling an electronic component, by which the working efficiency can be improved.

Another object of the present invention is to provide a method of and an apparatus for assembling an electronic component, by which the electrode surfaces of the element will not be damaged in assembling operation.

In the method of the present invention, first the terminal plates are inserted in a receiving portion of a base means so as to align the terminal plates along a direction of thickness thereof. Then, the element is inserted between the terminal plates in the receiving portion. If the terminal plates are inclined or slanted in the receiving portion, the element cannot be smoothly inserted between the terminal plates. Therefore, the base means may preferably be provided with lead portion receiving holes on a bottom of the receiving portion so as to hold the terminal plates self-sustainably. Also, a spring plate may be inserted in the receiving portion at an outside of one of the terminal plates. Thereafter, the terminal plates and the element are compressed along the direction of thickness. On the other hand, the case is carried to the base means, and set on the base means so that an opening of the case corresponds to the receiving portion. Then, the terminal plates and the element are inserted from the base means into the case simultaneously.

According to the present invention, inner parts such as the terminal plates and the element are assembled in the base means first, and then these parts are compressed and inserted into the case all at once. By this compressed insertion, the assembling efficiency is highly improved as compared with the one-by-one insertion.

Moreover, since all of the inner parts are inserted into the case simultaneously, they are not in sliding contact with each other, whereby the electrode surfaces of the element are not damaged and reliability is improved.

Further, since the operations such as assembling the inner parts in the base means and inserting the inner parts into the case can be carried out automatically, the working efficiency is highly improved as compared with the manual assembly.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a sectional view showing a conventional four-element ladder-type filter;

FIG. 2 is an exploded perspective view of the filter shown in FIG. 1;

DESCRIPTION OF THE PREFERRED EMBODIMENTS

Figure 3:
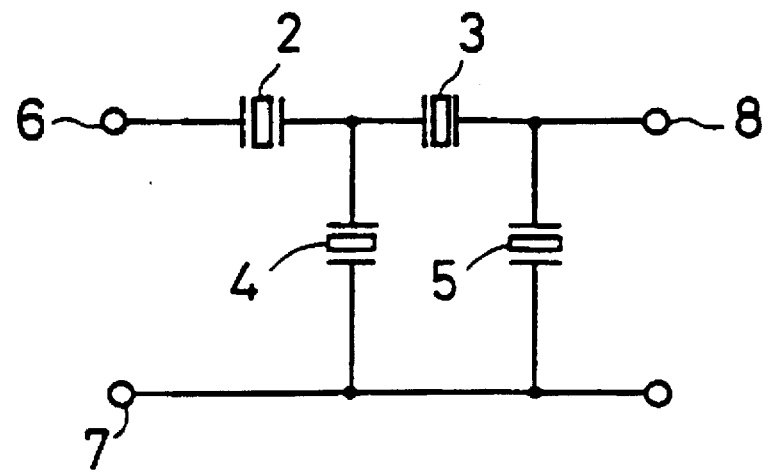
FIG. 3 is an electric circuit diagram of the filter shown in FIG. 1.
Figure 4:
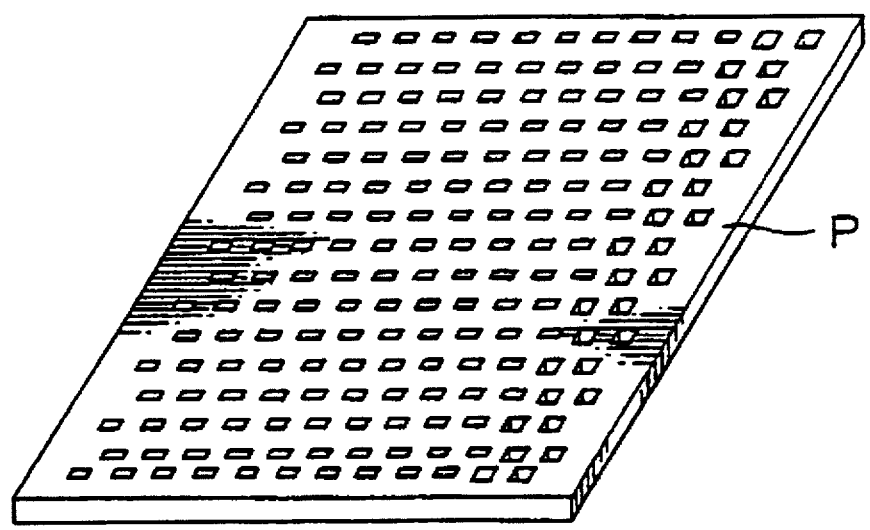
FIG. 4 is a perspective view showing a pallet.
Figure 5:
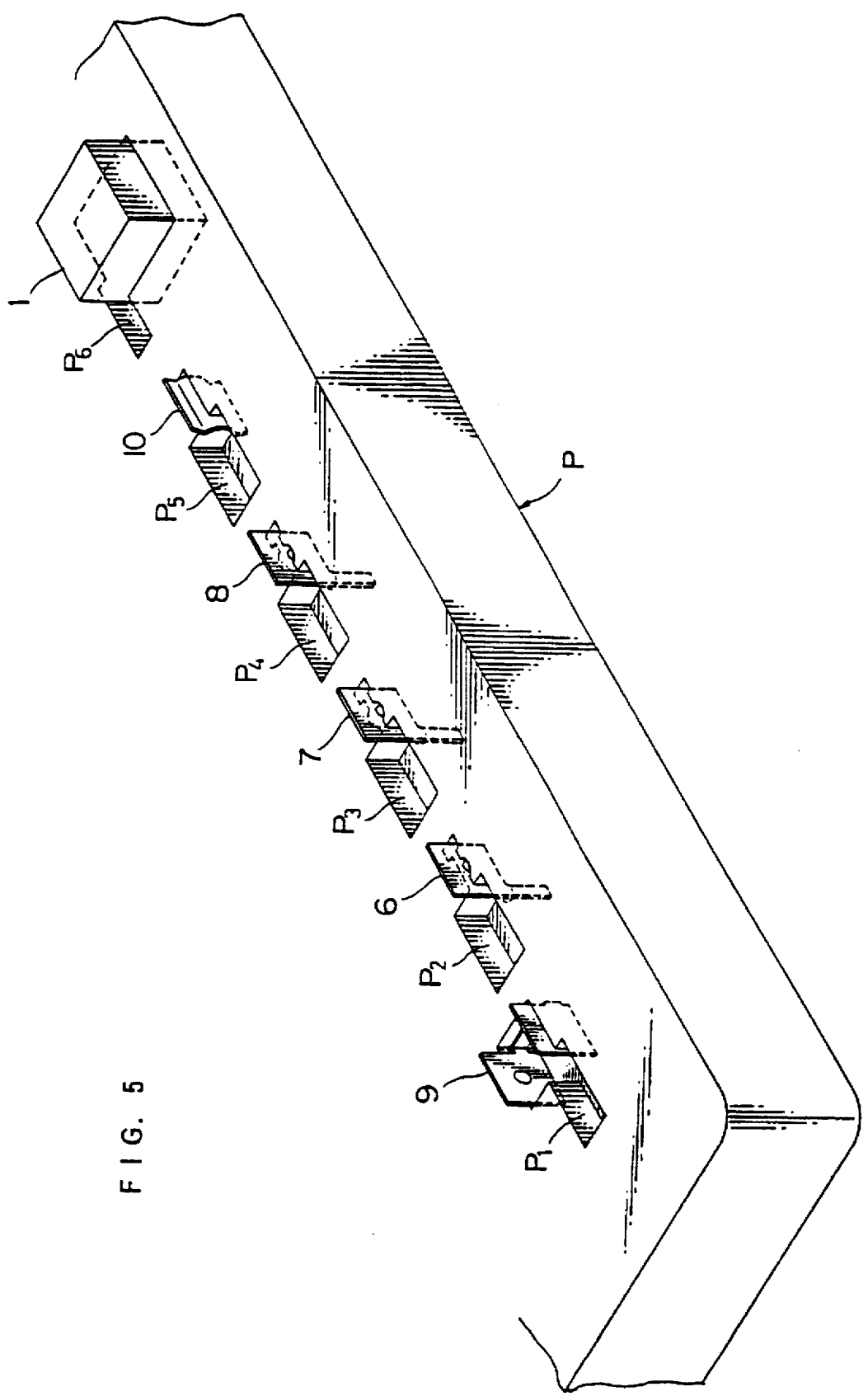
FIG. 5 is a partially enlarged perspective view showing the pallet shown in FIG. 4.

FIGS. 4 and 5 illustrate an exemplary pallet P which is employed in the present invention. This pallet P is a plate which has a number of cavities $P_1$–$P_6$ on an upper surface thereof for receiving respective parts separately in constant arrangement. The internal connection terminal plate 9, the input terminal plate 6, the ground terminal plate 7, the output terminal plate 8, the plate spring 10 and the case 1 as shown in FIGS. 1 and 2, are inserted and vertically held in the cavities $P_1$–$P_6$ respectively. When the parts are thus inserted in this pallet P, upper halves of the parts protrude from the upper surface of the pallet P.

Figure 6:
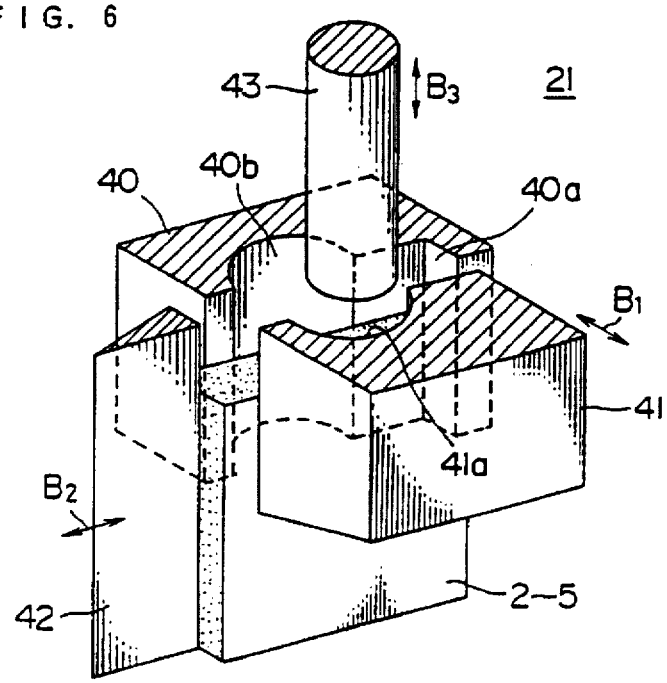
FIG. 6 is a perspective view showing a chuck hand.

FIG. 6 shows a chuck hand 21. The chuck hand 21 is used to chuck the terminal plates 6–9, the case 1 and the plate spring 10 from the pallet P to insert them into an assembly jig 31 as described later one by one, and is used to chuck the resonators 2–5 from an element supply unit 30 as described later to insert them into the assembly jig 31 one by one. The chuck hand 21 has a fixed pawl 40 for holding one major surface of each part such as the resonator and the terminal plate, a first movable pawl 41 which moves along the direction $B_1$ for holding the other major surface of each part, a second movable pawl 42 which moves along the direction $B_2$ perpendicular to the direction $B_1$, and an insertion pusher 43 which is movable in the vertical direction $B_3$. The fixed pawl 40 is provided with a stopper surface 40a for positioning a rear edge of each part, and a vertical groove 40b which can be passed through by the pusher 43. The first movable pawl 41 is also provided on its inner surface with a vertical groove 41a corresponding to the groove 40b. The second movable pawl 42, which is used to push a front edge of each part against the stopper surface 40a of the fixed pawl 40 for correctly positioning the part, has a wedge-shaped cross-sectional surface. The second movable pawl 42, which extends downwardly beyond the pawls 40 and 41, also serves as a guide for inserting the resonators 2–5 between the terminals 6–9, as hereinafter described. The pusher 43 is used to downwardly push each part, which is chucked by the three pawls 40, 41 and 42.

Figure 7A:
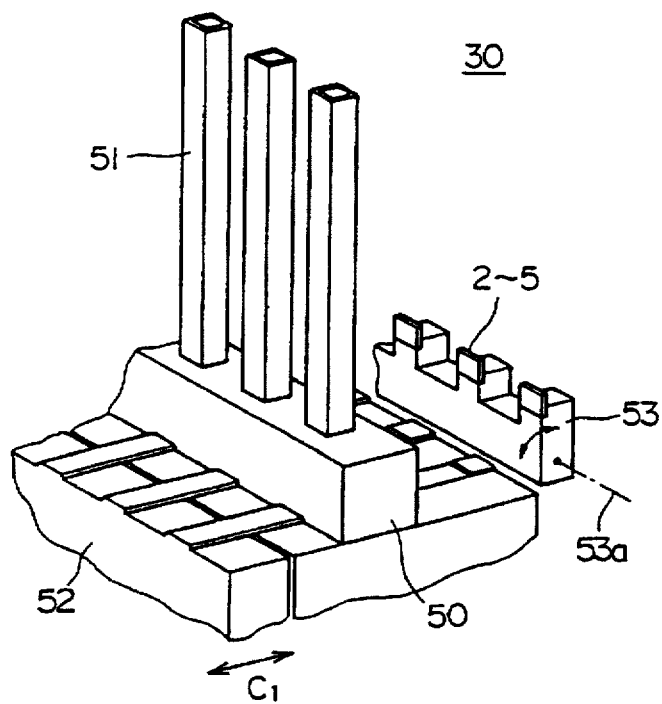
FIG. 7A is a perspective view showing an element-supply unit.
Figure 7B:
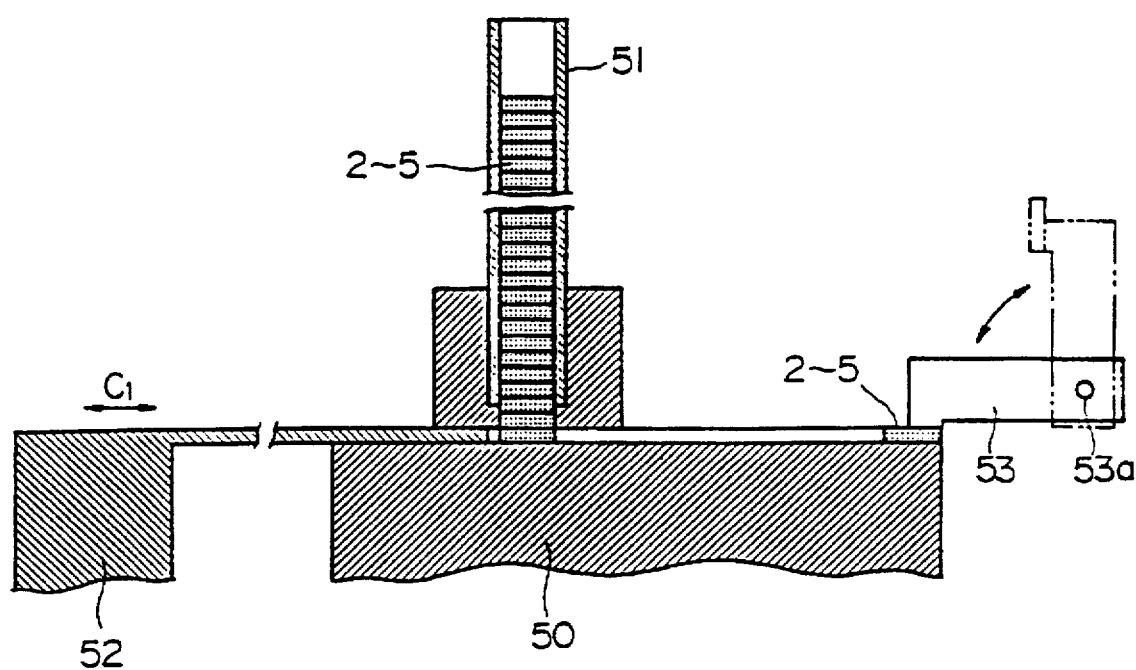
FIG. 7B is a sectional view showing an element-supply unit shown in FIG. 7A.

As shown in FIGS. 7A and 7B, the element-supply unit 30 comprises a body 50 and a plurality of cassettes 51 which stand uprightly on the body 50, and a pusher 52 which moves along the direction $C_1$. A number of resonators 2–5 of the same type are stacked in each of the cassettes 51. First, resonators 2–5 come down from lower ends of the cassettes 51 in front of the pusher 52, and then are pushed forwardly one by one by the pusher 52 to the forward end of the body 50. Next, the resonators 2–5 are sucked by a vacuum suction member 53 so as to be upwardly rotated about an axis 53a by about 90 degrees. Thereafter, the resonators 2–5 are chucked by the chuck hand 21, and carried into the assembly jig 31. When the cassettes 51 are vacated, they can be easily exchanged by new ones.

Figure 8:
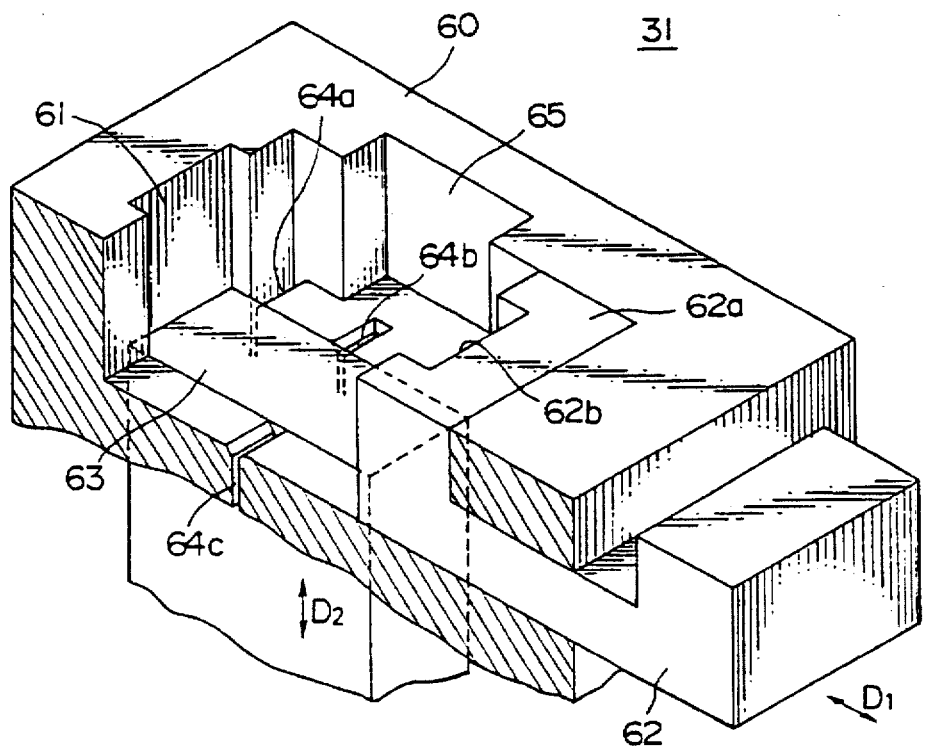
FIG. 8 is a perspective view showing an assembly jig.
Figure 9:
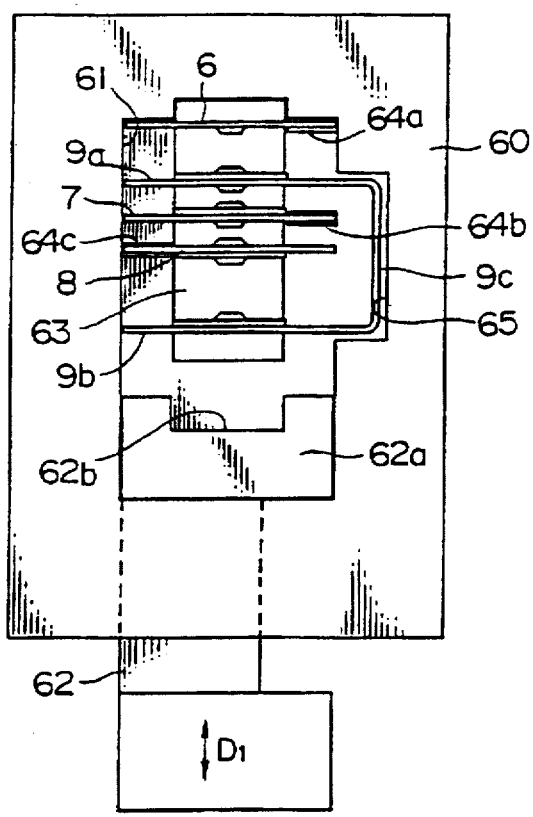
FIG. 9 is a plan view showing the assembly jig receiving terminal plates.

As shown in FIGS. 8 and 9, the assembly jig 31 is provided with a base 60 having a cavity 61 on an upper surface thereof for receiving the inner parts such as the resonators. The depth of the cavity 61 is set to be longer than half of the height of these inner parts and shorter than the height thereof. The jig 31 is also provided with a presser 62 which is movable along a horizontal direction $D_1$ so that a head portion 62a of the presser 62 is arranged on one end of the cavity 61. The head portion 62a of the presser 62 has an escape groove 62b on forward end surface thereof. An ejector 63 which is vertically movable along a direction $D_2$ is arranged at a central portion of a bottom of the cavity 61. Also, lead portion receiving holes 64a–64c which extend vertically are formed on the bottom of the cavity 61 beside the ejector 63, and are provided with tapered openings at the top thereof. Therefore, the terminals 6–8 are held self-sustainably in the cavity 61 when lead portions 6b, 7c and 8c of the terminals 6–8 are inserted in the holes 64a–64c respectively. An concave portion 65 is provided on one side surface of the cavity 61 to locate the coupling portion 9c of the internal connection terminal 9. The terminals 6–9 are located on constant positions by inner side surfaces of the cavity 61, the holes 64a–64c and the escape portion 65.

An operation for assembling the respective parts in the assembly jig 31 is now described.

Figure 10:
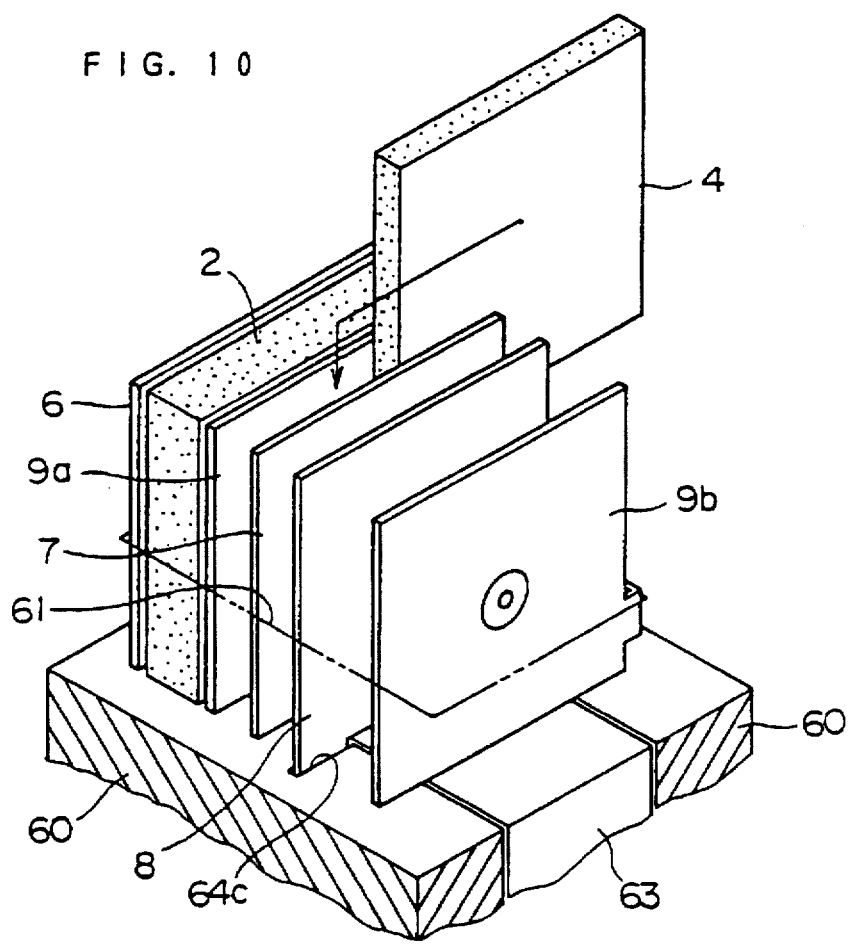
FIG. 10 is a perspective view showing an operation for inserting a resonator between terminal plates.
Figure 11A:
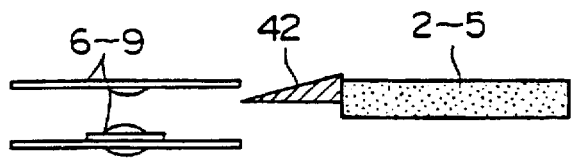
FIGS. 11A and 11B are plan views showing an operation for inserting a resonator between terminal plates.
Figure 11B:
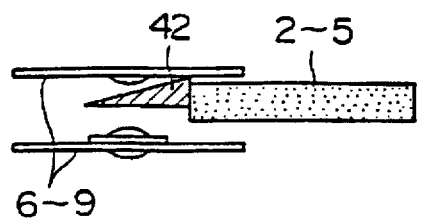

First, the terminal plates 6–9 which are taken out from the pallet P by the chuck hand 21 are inserted in the cavity 61 of the assembly jig 31 one by one (see FIG. 9). Then the resonators 2–5 which are carried from the element-supply unit 30 by the chuck hand 21 are inserted between the terminals 6–9 one by one. In particular, as shown in FIG. 10, the resonators 2–5 are laterally inserted between the terminals 6–9 along the upper surface of the base 60, and then the resonators 2–5 are downwardly pushed by the pusher 43 when they reach the position corresponding to the cavity 61. At this time, the terminals 6–9 which are already assembled in the assembly jig 31 self-sustainably may be slightly inclined or slanted so as to hinder the insertion of the resonators 2–5. However, since the second pawl 42 of the chuck hand 21 having a wedge-shaped section separates the terminals 6–9 from each other as shown in FIGS. 11A and 11B, it is possible to smoothly insert the resonators 2–5 between the terminals 6–9. When the resonators 2–5 are inserted, electrode surfaces thereof are not damaged since no compressive force acts between the terminals 6–9. After the resonators 2–5 are inserted in the aforementioned manner, the plate spring 10 is inserted in a clearance between the portion 9b of the terminal 9 and the presser 62.

Figure 12A:
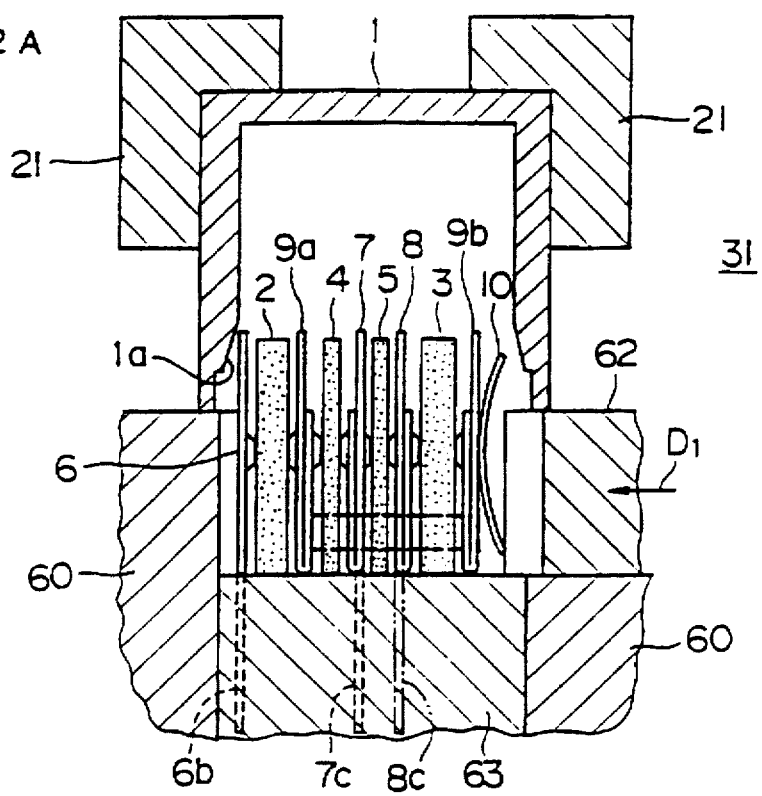
FIGS. 12A and 12B are sectional views of the assembly jig showing an operation for inserting parts in a case.
Figure 12B:
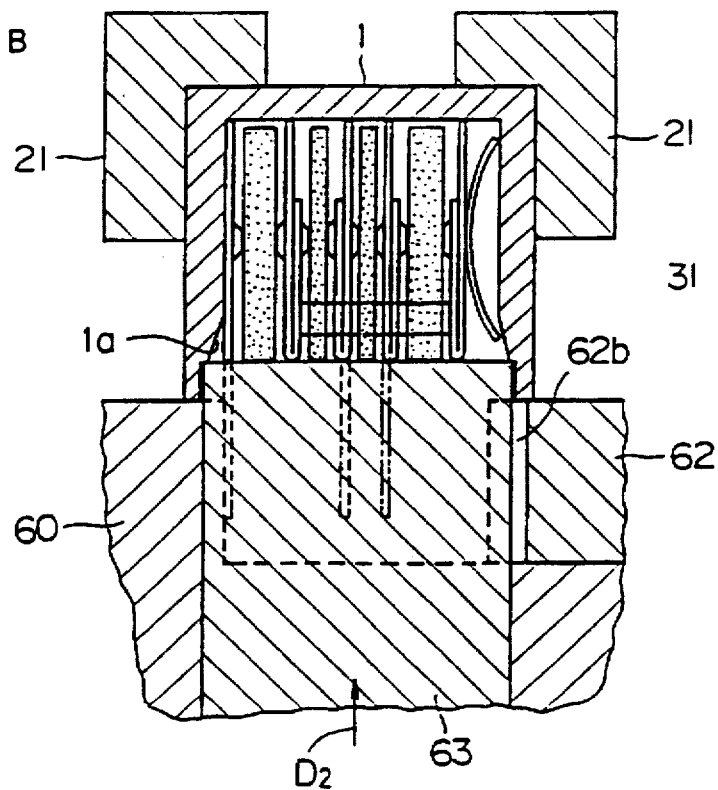

After all parts are assembled in the cavity 61 of the assembly jig 31, the parts are sidewardly compressed by the presser 62 as shown in FIG. 12A, so that the overall thickness of the parts is smaller than the inner size of the case 1. Then, the case 1 is carried from the pallet P onto the assembly jig 31 by the chuck hand 21, and located on a position for covering all parts which are projected on the base 60. Then, the ejector 63 is upwardly moved as shown in FIG. 12B so as to simultaneously insert all parts in the case 1. At this time, the parts are smoothly inserted due to an inclined surface 1a which is formed in an opening of the case 1. Further, the electrode surfaces of the resonators 2–5 are not damaged since the resonators 2–5 are not in sliding contact with the terminals 6–9.

After the inner parts are inserted in the case 1 in the aforementioned manner, the case i which is chucked by the chuck hand 21 is carried to the cover sheet fitting unit (not shown), so that the cover sheet 11 is fitted into the opening of the case 1. After the cover sheet 11 is fitted into the case 1, an assembled product is carried to a next sealing step, where the opening of the case 1 is sealed with resin 12 to obtain a final product.

Figure 13:
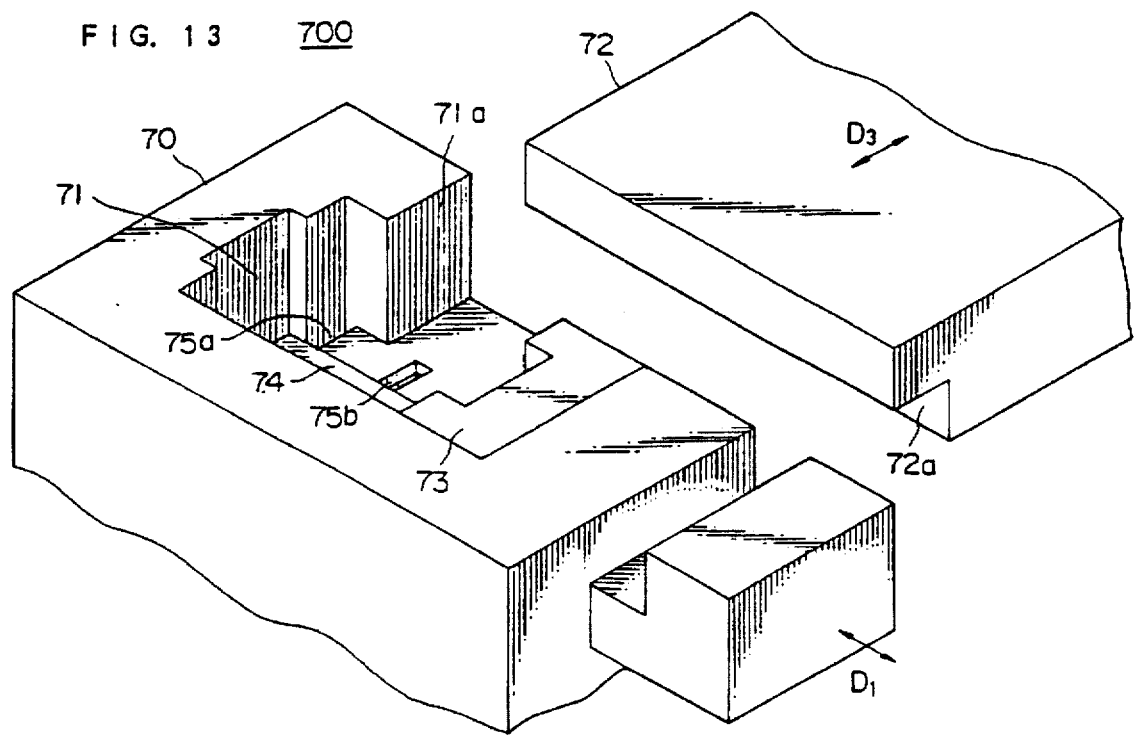
FIG. 13 is a perspective view showing an assembly jig according to a second embodiment of the present invention.
Figure 14:
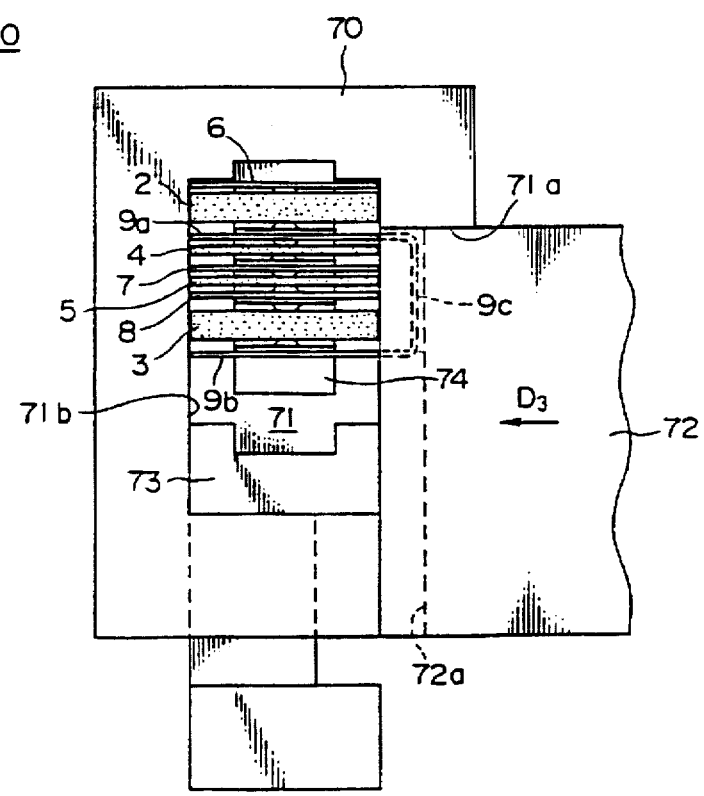
FIG. 14 is a plan view of the assembly jig shown in FIG. 13 receiving terminals and resonators.

FIGS. 13 and 14 show an assembly jig 700 according to a second embodiment of the present invention. Inner parts which are assembled by the jig 700 are identical to those of the first embodiment.

Referring to these figures, the assembly jig 700 is provided with a base 70 having a cavity 71 on its upper surface for receiving inner parts. The cavity 71 has an opening 71a at one side portion. The jig 700 is also provided with a positioning plate 72 which is horizontally slidable along a direction $D_3$ for closing the opening 71a. The plate 72 has an escape of its 72a on a lower portion of its inner side edge in order to escape an interference with the coupling portion 9c of the internal connection terminal 9.

The presser 73, the ejector 74 and the lead portion receiving holes 75a and 75b are similar to those shown in the first embodiment.

According to this embodiment, inner parts such as terminals 6–9 and resonators 2–5 are first inserted in a cavity 71 when the opening 71a is opened. Next, the plate 72 is inwardly slid to close the opening 71a so as to press side portions of the inner parts (excluding the terminal 6 and the resonator 2) against an inner side surface 71b of the cavity 71. Therefore, the inner parts are positioned in the lateral direction as shown in FIG. 14. In this way, it is possible to smoothly insert the inner parts in a case 1.

Figure 15:
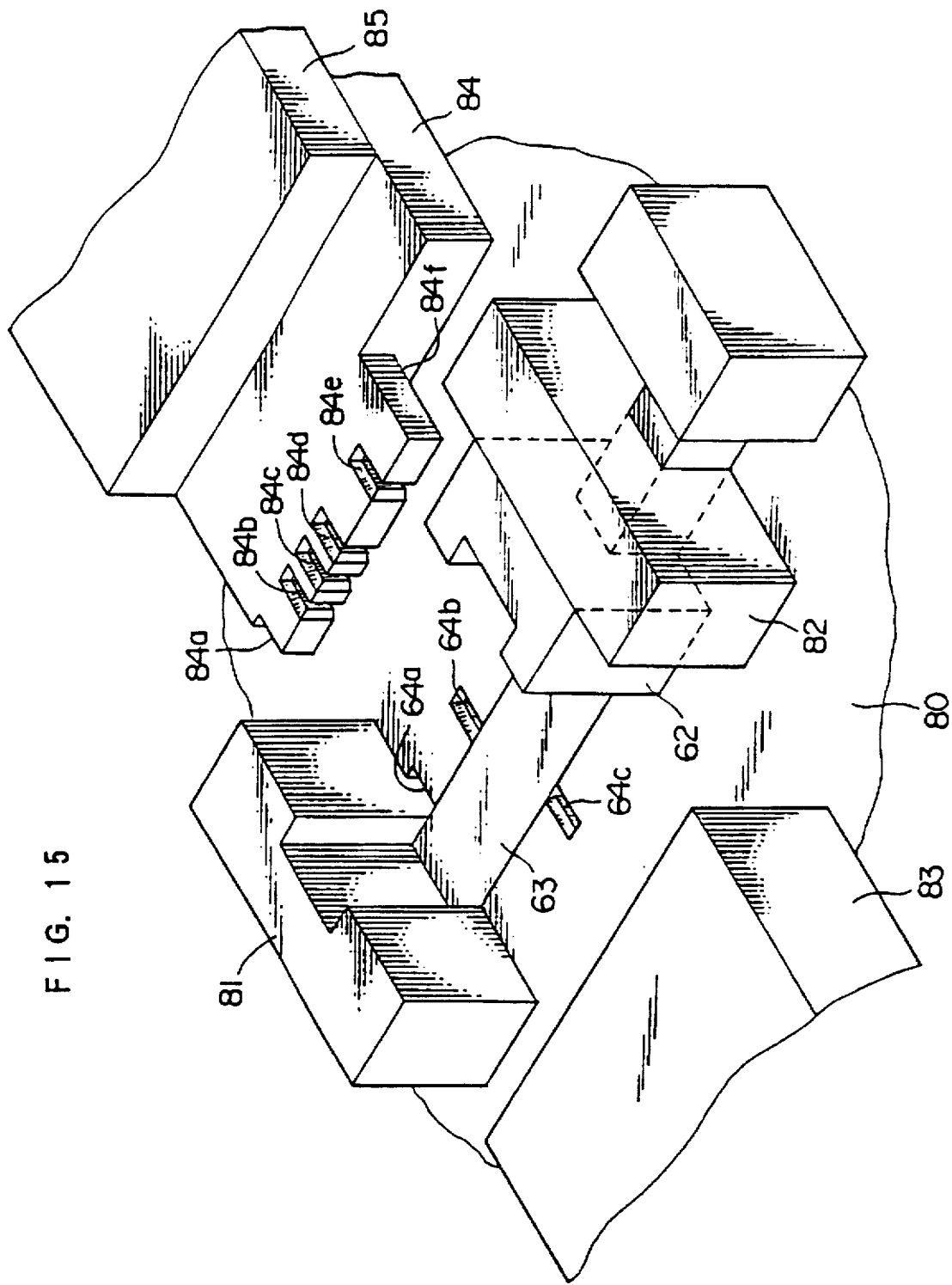
FIG. 15 is a perspective view showing an assembly jig according to a third embodiment of the present invention.

FIGS. 15–17 show an assembly jig 800 according to a third embodiment of the present invention.

Referring to the figures, the assembly jig 800 is provided with a base 80 having a pair of fixed guides 81 and 82 protruding thereon. A first positioning plate 83 which is horizontally slidable along a direction $D_4$ on the base 80 is arranged at one side between the guides 81 and 82. A second positioning plate 84 and a third positioning plate 85 which are horizontally slidable along a direction $D_5$ independently are arranged at the other side between the fixed guides 81 and 82. The thickness of the first plate 83 is equivalent to the height of the fixed guides 81 and 82, while the second and third plates 84 and 85 have substantially equivalent thicknesses, the sum of which is equivalent to the thickness of the plate 83. The second plate 84, which is arranged under the third positioning plate 85, is provided on its inner side edge with comb-shaped terminal receiving grooves 84a–84e. The second plate 84 is also provided on a lower portion of its inner side edge with an escape portion 84f in order to escape an interference with the coupling portion 9c of the internal connection terminal 9.

The presser 86, the ejector 87 and the lead portion receiving holes 80a, 80b and 80c are similar to those shown in the first embodiment.

The operation of this embodiment is now described.

Figure 16A:
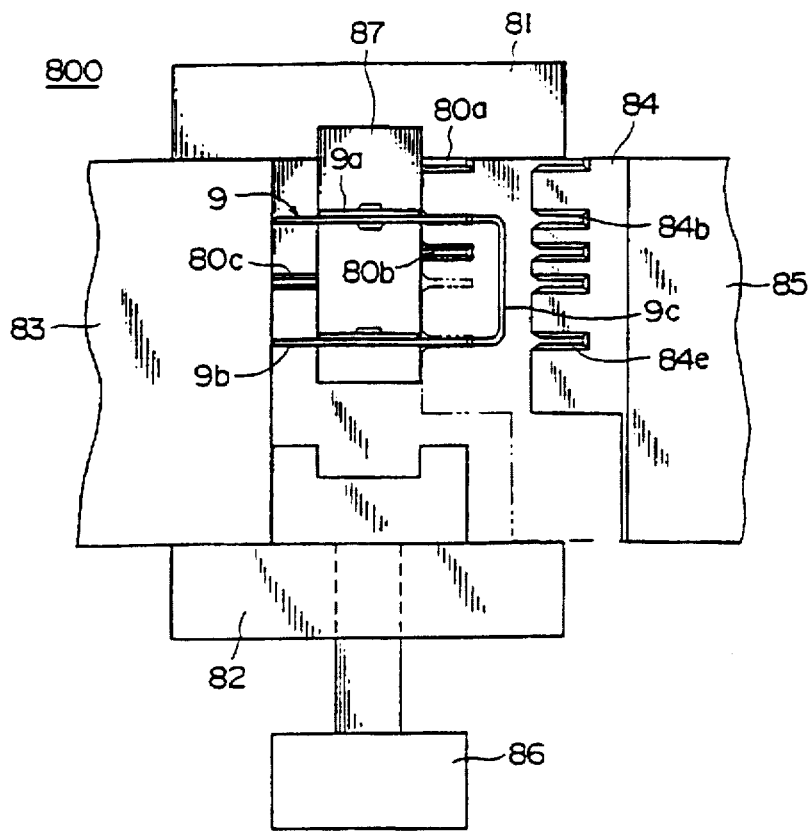
FIGS. 16A, 16B, 16C and 16D are plan views of the assembly jig shown in FIG. 15 receiving terminals and resonators.

First, as shown in FIG. 16A, the first plate 83 is advanced while the second and third plates 84 and 85 are kept at retracted positions. The internal connection terminal 9 is inserted in a cavity which is defined by the first plate 83, the fixed guide 81 and a presser 86.

Next, the second plate 84 is advanced so as to push the internal terminal 9 against the first plate 83 as shown by two-dot chain lines in FIG. 16A. Thus the terminal 9 is held between the first and second plates 83 and 84, so as to be positioned in a lateral direction. At this time, the terminal receiving grooves 84b and 84e of the second plate 84 are engaged with the portions 9a and 9b of the terminal 9, so as to position the terminal 9 also in the direction of thickness.

Figure 16B:
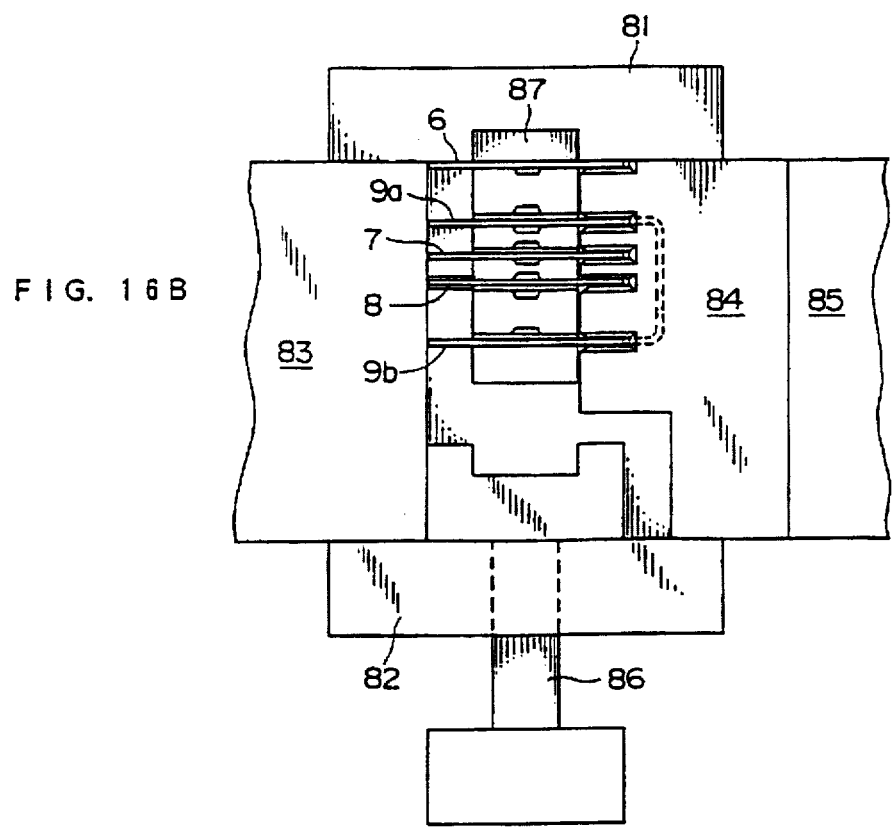

Then, as shown in FIG. 16B, an input terminal 6, an ground terminal 7 and an output terminal 8 are inserted one by one self-sustainably such that lead portions 6b, 7c and 8c of these terminals 6–8 are inserted in lead portion receiving holes 80a–80c provided on an upper surface of the base 80. At this time, side edge portions of the respective terminals 6–8 are held by the terminal receiving grooves 84a, 84c and 84d of the second plate 84, whereby these terminals 6–8 are positioned along the direction of thickness. Thereafter, the first plate 83 is retracted to a position shown in FIG. 16C.

Figure 16C:
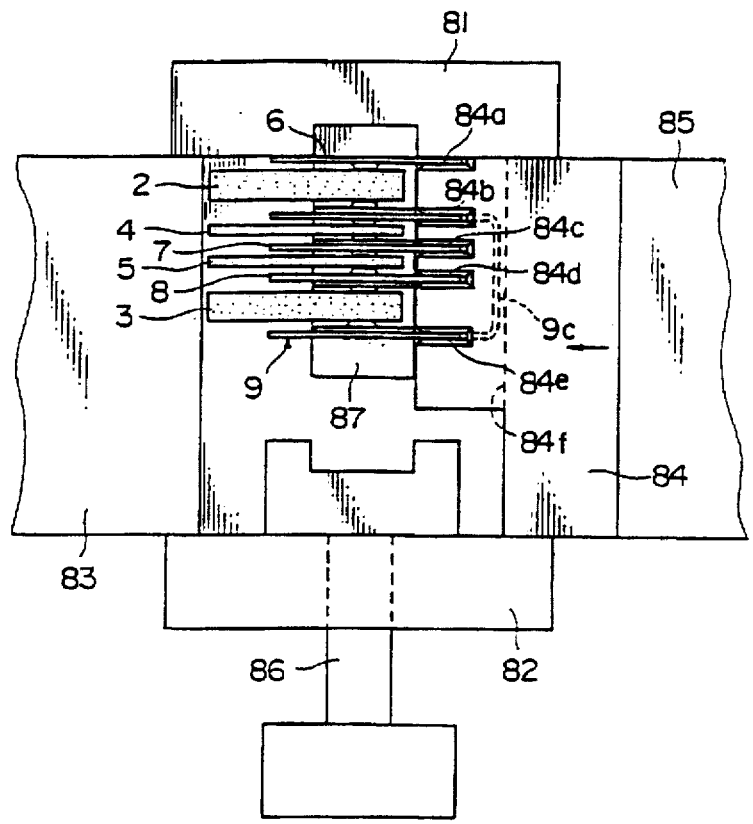

Then, resonators 2–5 are inserted one by one between the respective terminals 6–9, such that they are laterally displaced from centers of the terminals 6–9 as shown in FIG. 16C. At this time, since spaces between the terminals 6–9 are ensured by the terminal receiving grooves 84a–84e of the second plate 84, the resonators 2–5 can be smoothly inserted in the spaces without being hindered by the terminals 6–9.

Figure 16D:
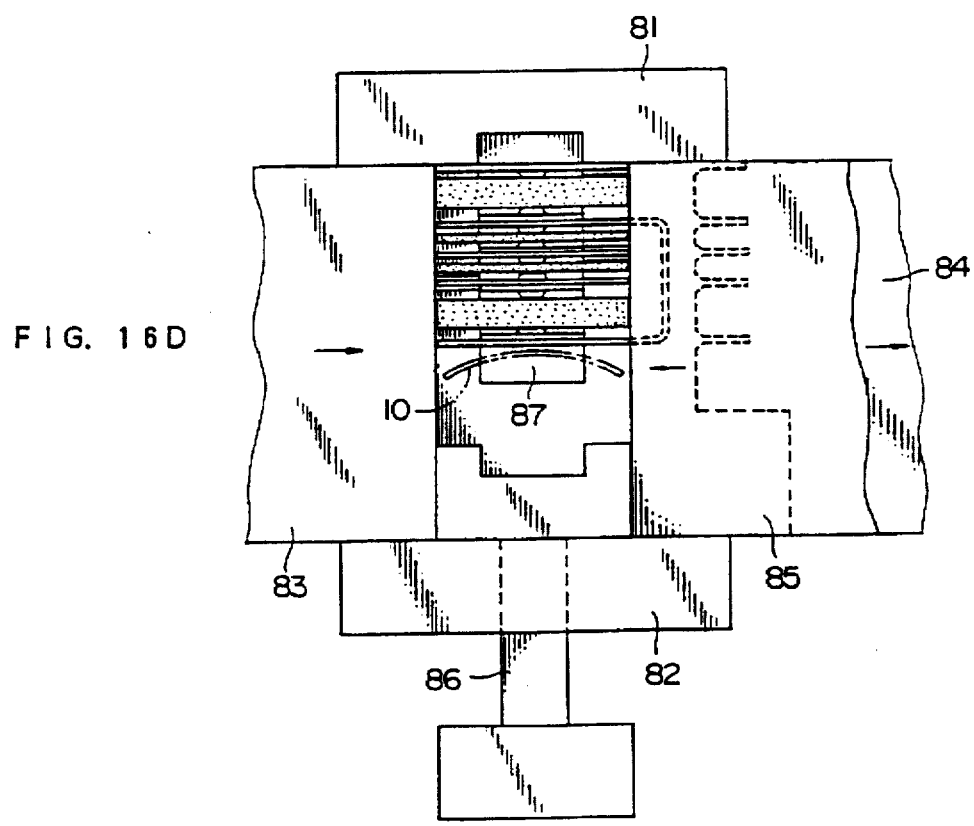

Then, the first and third plates 83 and 85 are advanced and the second plate 84 is retracted as shown in FIG. 16D, so that the resonators 2–5 are integrally slid toward the centers of the terminals 6–9. Thus, both side edges of all parts are held between the first and third plates 83 and 85 to be positioned accurately in the lateral direction.

Thereafter, a plate spring 10 is inserted between the terminal 9 and the presser 86, and all parts are compressed by the presser 86 and covered with a case 1. Then, the parts are ejected by a ejector 87 from below, to be integrally inserted in the case 1.

According to this embodiment, since a receiving portion for receiving the inner parts is formed by the fixed guides 81 and 82 and the positioning plates 83–85 which move laterally, the parts are held correctly in the lateral direction, thereby facilitating insertion of all parts in the case 1. Also, since the second positioning plate 84 has the terminal receiving grooves 84a–84e, the terminals 6–9 are held correctly in the direction of thickness, thereby facilitating insertion of the resonators 2–5 between the terminals 6–9.

The present invention is not restricted to the aforementioned embodiments, but various modifications are available, as a matter of course.

For example, though the parts are automatically inserted in the assembly jig by the chuck hand in the first embodiment, the parts may alternatively be inserted in the assembly jig manually.

Although the terminal plates, the plate springs and the cases are supplied by the pallet in the aforementioned embodiment, the resonators may also be supplied by the pallet. According to the aforementioned embodiment, the resonators are supplied from the element-supply unit which is independent of the pallet, for the reason that the resonators are generally varied with types of filters whereas the terminals, the plate springs and the cases are generally employed in common to various types of the filters.

Further, the present invention is also applicable to a two-element ladder-tape filter or a ladder-type filter having five or more elements, in addition to the four-element ladder-type filter appearing in each of the aforementioned embodiment. The present invention is applicable to any electronic component, so far as it comprises elements which are held between terminal plates under pressure and stored in a case.

Furthermore, the plate spring can be replaced by a rubber plate as a cushion member. Also, the cushion member can be eliminated if at least one of the terminal plates is made of a bent spring plate.

Moreover, the setting means in the present invention is not restricted to the chuck hand, but can be replaced by any means as far as it can set and hold the case on the assembly jig.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for assembling an electronic component having at least one element being held between terminal plates under pressure and stored in a case said apparatus comprising:

a base having a receiving portion on an upper surface thereof for receiving said element and said terminal plates so as to align said element and said terminal plates along a direction of thickness thereof;

a press for compressing said element and said terminal plates received in said receiving portion in the direction of thickness;

a setting device for setting said case on said base so that an opening of said case corresponds to said receiving portion; and an ejector for simultaneously inserting said element and said terminal plates from said receiving portion into said case, wherein said receiving portion is a cavity which is formed on an upper surface of said base, said press being laterally movable has a head portion which is arranged on one end of said cavity in order to compress said element and said terminal plates, and wherein said ejector being vertically movable is arranged at a bottom of said cavity in order to push lower ends of said element and said terminal plates.

2. An apparatus for assembling an electronic component in accordance with claim 1, wherein said cavity has an inner size being larger than that of said case in the direction of thickness.

3. An apparatus for assembling an electronic component in accordance with claim 1, wherein said cavity has a depth being longer than half of a height of said element and shorter than the height thereof.

4. An apparatus for assembling an electronic component in accordance with claim 1, wherein said terminal plates have lead portions outwardly protruding from said case, and wherein said cavity is provided with lead portion receiving holes on said bottom thereof for receiving said lead portions of said terminal plates so as to hold said terminal plates self-sustainably.

5. An apparatus for assembling an electronic component in accordance with claim 1, wherein said electronic component has a cushion member for bringing said terminal plates and said element into pressure contact with each other to be electrically connected, and wherein said cushion member is inserted in said cavity between said press and one of said terminal plates.

6. An apparatus for assembling an electronic component having at least one element being held between terminal plates under pressure and stored in a case, said apparatus comprising:

a base having a receiving portion on an upper surface thereof for receiving said element and said terminal plates so as to align said element and said terminal plates along a direction of thickness thereof;

a press for compressing said element and said terminal plates received in said receiving portion in the direction of thickness;

a setting device for setting said case on said base so that an opening of said case corresponds to said receiving portion; and an ejector for simultaneously inserting said element and said terminal plates from said receiving portion into said case, wherein said receiving portion is a cavity which has a side opening at one side portion thereof in addition to an upper opening, and wherein said apparatus further comprises a positioning plate arranged at said side opening for positioning one side edges of said terminal plates and said element.

7. An apparatus for assembling an electronic component in accordance with claim 6, wherein said terminal plates have lead portions outwardly protruding from said case, and wherein said cavity is provided with lead portion receiving holes on a bottom thereof for receiving said lead portions of said terminal plates so as to hold said terminal plates self-sustainably.

8. An apparatus for assembling an electronic component having at least one element being held between terminal plates under pressure and stored in a case, said apparatus comprising:

a base having a receiving portion on an upper surface thereof for receiving said element and said terminal plates so as to align said element and said terminal plates along a direction of thickness thereof;

a press for compressing said element and said terminal plates received in said receiving portion in the direction of thickness;

a setting device for setting said case on said base so that an opening of said case corresponds to said receiving portion; and an ejector for simultaneously inserting said element and said terminal plates from said receiving portion into said case, wherein said base has a pair of guide portions on an upper surface thereof, said apparatus further comprises a first positioning plate, a second positioning plate and a third positioning plate, said first positioning plate is laterally movable between said guide portions at one side for positioning one side edges of said element and said terminal plates, said second positioning plate is laterally movable between said guide portions at the other side for positioning the other side edges of said element and said terminal plates, and wherein said third positioning plate is laterally movable between said guide portions at the same side as said second positioning plate and has terminal receiving grooves on an inner side edge thereof for holding said terminal plates in the direction of thickness.

9. An apparatus for assembling an electronic component in accordance with claim 8, wherein said terminal plates have lead portions outwardly protruding from said case, and wherein said base is provided with lead portion receiving holes on said upper surface for receiving said lead portions of said terminal plates so as to hold said terminal plates self-sustainably.

* * * * *